(12) United States Patent
Kim et al.

(10) Patent No.: US 12,477,805 B2
(45) Date of Patent: Nov. 18, 2025

(54) SEMICONDUCTOR DEVICES

(71) Applicant: SAMSUNG ELECTRONICS CO., LTD., Suwon-si (KR)

(72) Inventors: Jeongik Kim, Suwon-si (KR); Chunghwan Shin, Suwon-si (KR); Jaemoon Lee, Suwon-si (KR); Seongdong Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 18/144,618

(22) Filed: May 8, 2023

(65) Prior Publication Data
US 2023/0411472 A1    Dec. 21, 2023

(30) Foreign Application Priority Data
Jun. 21, 2022 (KR) .................. 10-2022-0075503

(51) Int. Cl.
*H10D 64/23* (2025.01)
*H10D 30/43* (2025.01)
*H10D 30/67* (2025.01)
*H10D 62/10* (2025.01)

(52) U.S. Cl.
CPC .......... *H10D 64/258* (2025.01); *H10D 30/43* (2025.01); *H10D 30/6735* (2025.01); *H10D 30/6757* (2025.01); *H10D 62/121* (2025.01)

(58) Field of Classification Search
CPC .................................................. H10D 64/258
See application file for complete search history.

(56) References Cited

U.S. PATENT DOCUMENTS

| | | | |
|---|---|---|---|
| 5,015,603 A | * | 5/1991 | Boos ................ H10D 62/85 |
| | | | 257/E29.144 |
| 9,978,583 B2 | | 5/2018 | Tsai et al. |
| 10,283,608 B2 | | 5/2019 | Zhang et al. |
| 10,847,367 B2 | | 11/2020 | Economy et al. |
| 11,158,539 B2 | | 10/2021 | Wang et al. |
| 2011/0159690 A1 | | 6/2011 | Chandrashekar et al. |
| 2013/0302980 A1 | | 11/2013 | Chandrashekar et al. |
| 2021/0184018 A1 | | 6/2021 | Khaderbad et al. |
| 2021/0305059 A1 | | 9/2021 | Lai et al. |
| 2024/0387574 A1 | * | 11/2024 | Chen .............. H10F 39/8037 |

\* cited by examiner

*Primary Examiner* — Douglas M Menz
(74) *Attorney, Agent, or Firm* — Sughrue Mion, PLLC

(57) ABSTRACT

A semiconductor device includes a substrate; an active region extending in a first direction on the substrate; a gate structure extending in a second direction on the substrate and including a gate electrode; a source/drain region provided on the active region on at least one side of the gate structure; an interlayer insulating layer covering the gate structure; a first contact structure connected to the source/drain region on at least one side of the gate structure; and a gate contact structure passing at least partially through the interlayer insulating layer and connected to the gate electrode, wherein the gate contact structure includes: a first layer including a conductive material; a second layer provided on the first layer, spaced apart from the interlayer insulating layer by the first layer, and including first impurities; and a third layer provided on the second layer and including second impurities.

20 Claims, 18 Drawing Sheets

SEMICONDUCTOR DEVICES

CROSS-REFERENCE TO RELATED APPLICATION(S)

This application claims priority to Korean Patent Application No. 10-2022-0075503, filed on Jun. 21, 2022, in the Korean Intellectual Property Office, the disclosure of which is incorporated by reference herein in its entirety.

BACKGROUND

The present disclosure relates to a semiconductor device.

As demand for high performance, high speed, and/or multifunctionality of semiconductor devices has increased, a degree of integration of semiconductor devices has increased. In manufacturing a semiconductor device having a fine pattern corresponding to the trend for high integration of the semiconductor device, patterns having a fine width or a fine separation distance may be implemented. In addition, in order to overcome the limitations of operating characteristics due to the reduction in size of planar metal oxide semiconductor FETs (MOSFETs), efforts are being made to develop semiconductor devices including FinFETs having a three-dimensional (3D) channel structure.

SUMMARY

Example embodiments provide a semiconductor device having improved electrical characteristics.

According to an aspect of an example embodiment, a semiconductor device includes: a substrate; an active region extending in a first direction on the substrate; a gate structure extending in a second direction on the substrate and crossing the active region, the gate structure including a gate electrode; a source/drain region provided on the active region on at least one side of the gate structure; an interlayer insulating layer covering the gate structure; a first contact structure connected to the source/drain region on at least one side of the gate structure; and a gate contact structure passing at least partially through the interlayer insulating layer and connected to the gate electrode, wherein the gate contact structure includes: a first layer including a conductive material; a second layer provided on the first layer and including first impurities; and a third layer provided on the second layer and including second impurities that are different from the first impurities, and the second layer is spaced apart from the interlayer insulating layer by the first layer.

According to an aspect of an example embodiment, a semiconductor device includes: a substrate; an active region extending in a first direction on the substrate; a plurality of channel layers provided on the active region and spaced apart from each other in a vertical direction that is perpendicular to an upper surface of the substrate; a gate structure extending in a second direction on the substrate, crossing the active region and the plurality of channel layers, and surrounding each of the plurality of channel layers, the gate structure including a gate electrode; a source/drain region provided on the active region on at least one side of the gate structure; a first contact structure connected to the source/drain region on at least one side of the gate structure; and a gate contact structure provided on and connected to the gate electrode, wherein the gate contact structure includes: a first layer formed of a conductive material; a second layer provided on the first layer and including first impurities; and a third layer provided on the second layer and including second impurities, different from the first impurities, wherein the first layer has a first thickness in the vertical direction below the second layer, the first layer has a second thickness in a horizontal direction on a side surface of the second layer, and the first thickness is greater than the second thickness.

According to an aspect of an example embodiment, a semiconductor device includes: a substrate; an active region extending in a first direction on the substrate; a plurality of channel layers provided on the active region and spaced apart from each other in a vertical direction that is perpendicular to an upper surface of the substrate; a gate structure extending in a second direction on the substrate, crossing the active region and the plurality of channel layers, and surrounding each of the plurality of channel layers, the gate structure including a gate electrode; a source/drain region provided on the active region on at least one side of the gate structure; and a gate contact structure provided on and connected to the gate electrode, wherein the gate contact structure includes: a first layer including a conductive material; a second layer provided on the first layer and including at least one of boron (B) or silicon (Si); and a third layer provided on the second layer and including fluorine (F).

BRIEF DESCRIPTION OF DRAWINGS

The above and other aspects and features will be more apparent from the following description of example embodiments, taken in conjunction with the accompanying drawings, in which.

DETAILED DESCRIPTION

Hereinafter, example embodiments will be described with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
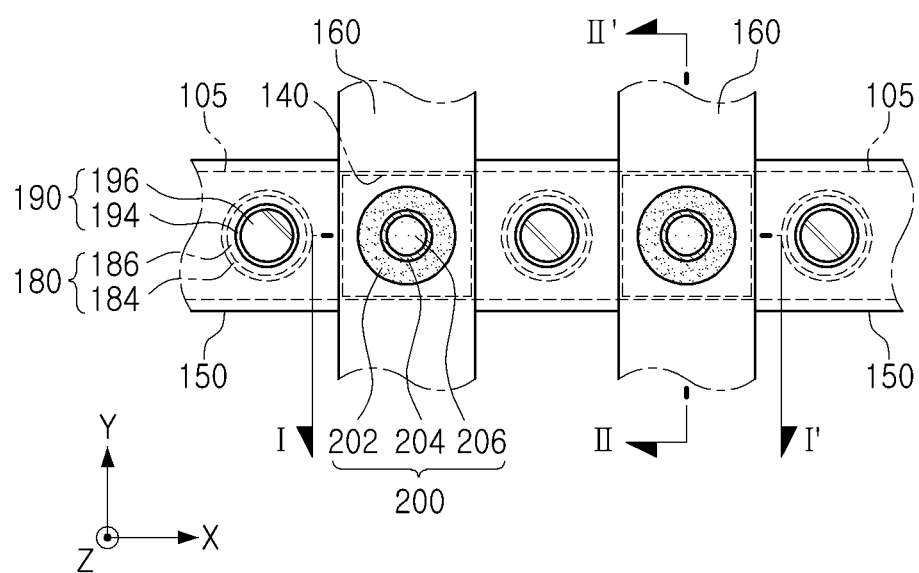
FIG. 1 is a plan view illustrating a semiconductor device according to example embodiments.

FIG. 1 is a plan view illustrating a semiconductor device according to example embodiments.

Figure 2A:
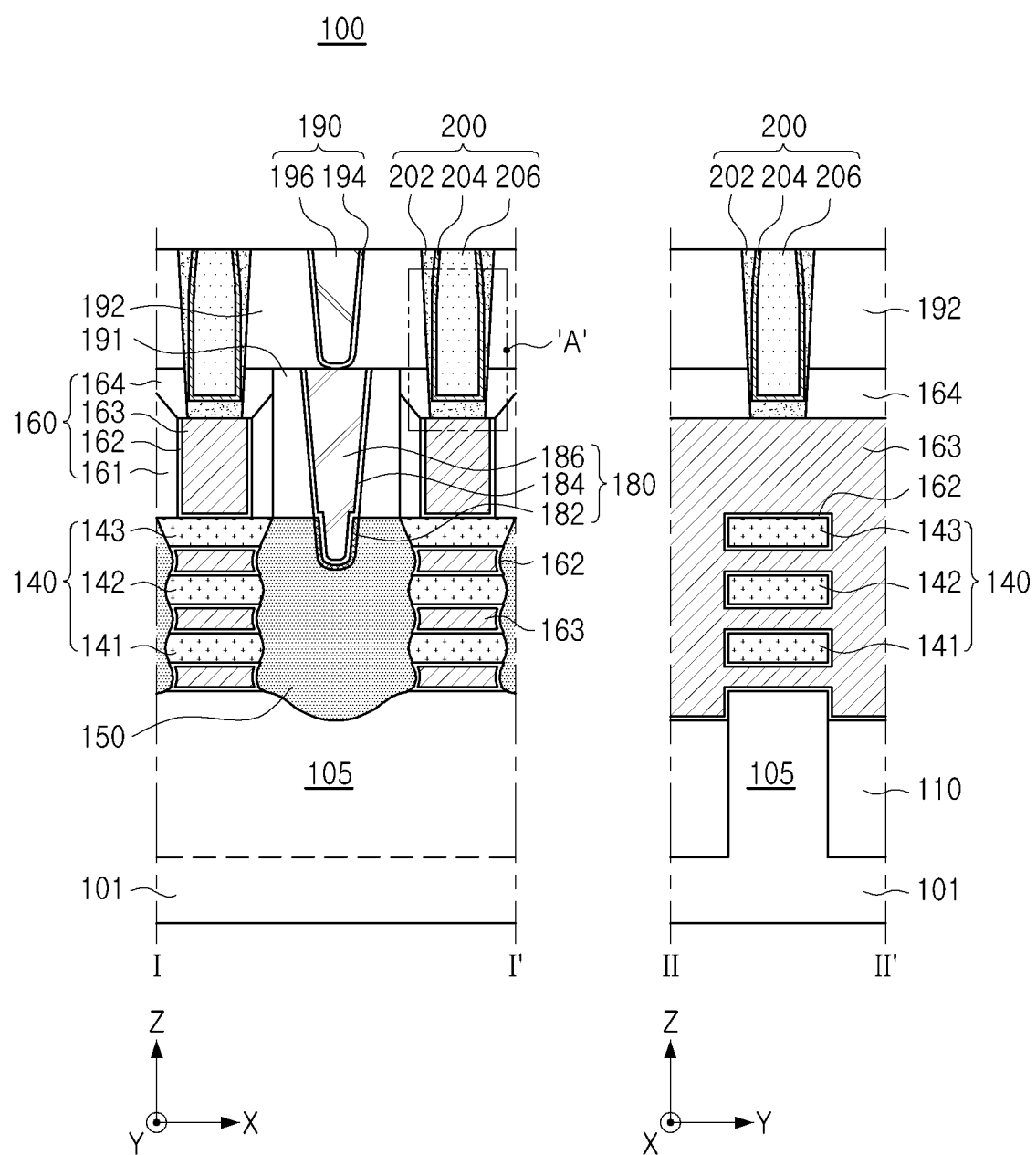
FIG. 2A is a cross-sectional view illustrating a semiconductor device according to example embodiments.

FIG. 2A is a cross-sectional view illustrating a semiconductor device according to example embodiments. FIG. 2A illustrates cross-sections of the semiconductor device of FIG. 1, taken along lines I-I' and II-II' respectively.

Figure 2B:
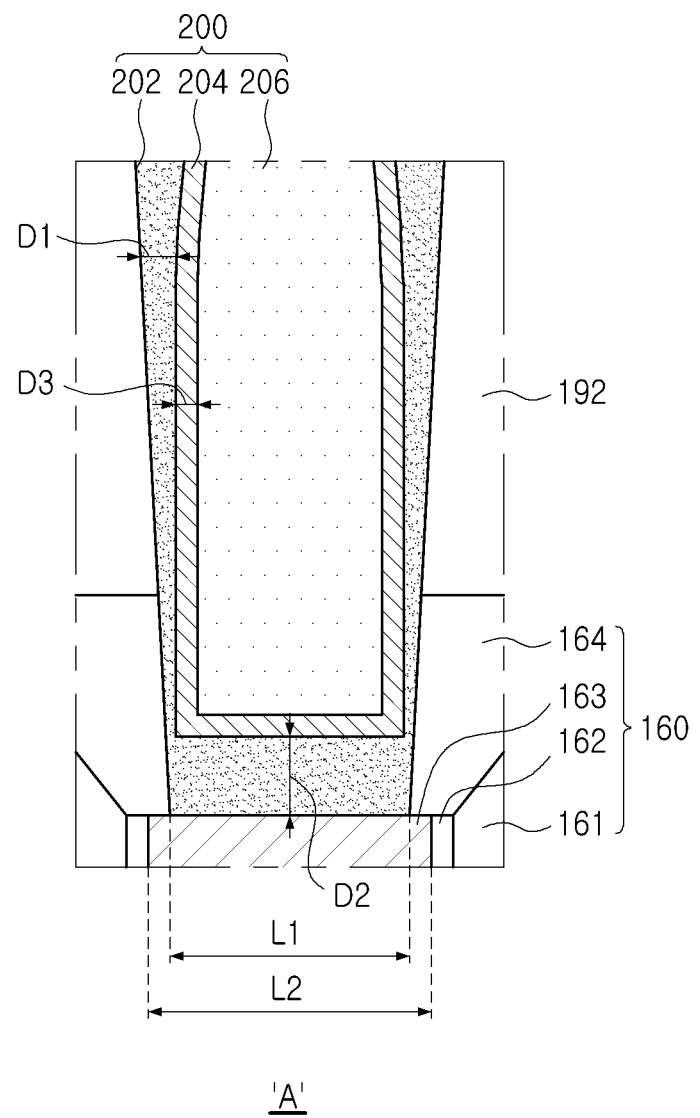
FIG. 2B is a partially enlarged view illustrating a portion of a semiconductor device according to example embodiments.

FIG. 2B is a partially enlarged view illustrating a portion of a semiconductor device according to example embodiments. FIG. 2B illustrates an enlarged view of portion 'A' of FIG. 2A.

For convenience of description, only major components of the semiconductor device are illustrated in FIG. 1.

Referring to FIGS. 1 to 2B, a semiconductor device 100 may include a substrate 101, an active region 105 on the substrate 101, a channel structure 140 including a plurality of channel layers 141, 142, and 143 disposed on the active region 105 to be perpendicular to each other and spaced apart from each other, a source/drain region 150 contacting the plurality of channel layers 141, 142, and 143, a gate structure 160 extending to intersect the active region 105, a first contact structure 180 connected to the source/drain region 150, a second contact structure 190 connected to the first contact structure 180, and a gate contact structure 200 connected to an gate electrode layer 163 of the gate structure 160. The semiconductor device 100 may further include device isolation layers 110 and interlayer insulating layers 191 and 192.

In the semiconductor device 100, the active region 105 may have a fin structure, and the gate electrode layer 163 may be disposed between the active region 105 and the channel structure 140, between the channel layers 141, 142, and 143 of the channel structure 140, and on the channel structure 140. Therefore, the semiconductor device 100 may include a gate-all-around type field effect transistor formed by the channel structure 140, the source/drain regions 150, and the gate structure 160, e.g., a multi-bridge channel FET (MBCFET™). The transistor may be, for example, an NMOS transistor or a PMOS transistor.

The substrate 101 may have an upper surface extending in an X-direction and a Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The device isolation layer 110 may define the active region 105 on the substrate 101. The device isolation layer 110 may be formed by, for example, a shallow trench isolation (STI) process. In some embodiments, the device isolation layer 110 may further include a region having a step difference and extending more deeply in a lower portion of the substrate 101. The device isolation layer 110 may partially expose an upper portion of the active region 105. In some embodiments, the device isolation layer 110 may have a curved upper surface having a higher level toward the active region 105. The device isolation layer 110 may be formed of an insulating material. The device isolation layer 110 may be, for example, an oxide, a nitride, or a combination thereof.

The active region 105 may be defined by the device isolation layer 110 in the substrate 101, and may be disposed to extend in a first direction, for example, the X-direction. The active region 105 may have a structure protruding from the substrate 101. An upper end of the active region 105 may be disposed to protrude to a predetermined height from the upper surface of the device isolation layer 110. The active region 105 may be formed as a portion of the substrate 101, or may include an epitaxial layer grown from the substrate 101. On both sides of the gate structure 160, the active region 105 on the substrate 101 may be partially recessed, and the source/drain regions 150 may be disposed on the recessed portion of the active region 105. Therefore, as illustrated in FIG. 2A, the active region 105 in the source/drain region 150 may have a relatively higher height than the lower portion of the gate structure 160. In some embodiments, the active region 105 may include impurities, and at least some of the active regions 105 may include impurities of different conductivity types, but embodiments of the present disclosure are not limited thereto. The active region 105 may be disposed as a plurality of active regions 105 to be spaced apart from each other in the Y-direction.

The channel structure 140 may include first to third channel layers 141, 142, and 143, which are formed on the active region 105 as two or more channel layers spaced apart from each other in a direction, perpendicular to an upper surface of the active region 105, for example, in the Z-direction. The first to third channel layers 141, 142, and 143 may be spaced apart from the upper surface of the active region 105 while being connected to the source/drain region 150. The first to third channel layers 141, 142, and 143 may have the same or a similar width as the active region 105 in the Y-direction, and may have the same or similar width as the gate structure 160 in the X-direction. In some embodiments, the first to third channel layers 141, 142, and 143 may have a reduced width such that side surfaces thereof are located below the gate structure 160 in the X-direction.

The first to third channel layers 141, 142, and 143 may be formed of a semiconductor material, and may include, for example, at least one of silicon (Si), silicon germanium (SiGe), or germanium (Ge). The first to third channel layers 141, 142, and 143 may be formed of, for example, the same material as that of the substrate 101. The number and shapes of the plurality of channel layers 141, 142, and 143 constituting one channel structure 140 may be variously changed in embodiments. For example, in some embodiments, the channel structure 140 may further include a channel layer disposed on the upper surface of the active region 105.

The source/drain region 150 may be disposed on the active region 105 on both sides of the channel structure 140. The source/drain region 150 may serve as a source region or a drain region of a transistor. The source/drain region 150 may be disposed by partially recessing an upper portion of the active region 105, but in embodiments, the presence or absence of a recess and a depth of the recess may be variously changed. The source/drain region 150 may include epitaxial layers disposed along a side surface of each of the first to third channel layers 141, 142, and 143 of the channel structure 140. The source/drain region 150 may include a plurality of epitaxial layers, but embodiments of the present disclosure are not limited thereto. The source/drain region 150 may be a semiconductor layer including silicon (Si) and/or germanium (SiGe). The source/drain regions 150 may include impurities of different types and/or concentrations. For example, the source/drain region 150 may include N-type doped silicon (Si) and/or P-type doped silicon germanium (SiGe). In example embodiments, the source/drain region 150 may include a plurality of regions including different concentrations of an element and/or a doping element. The source/drain region 150 may have a circular shape, an elliptical shape, a pentagonal shape, a hexagonal shape, or a similar shape thereto in cross-section in the Y-direction. In embodiments, the source/drain region 150 may have various shapes, for example, any one of a polygonal shape, a circular shape, or a rectangular shape.

The gate structure 160 may be disposed on the active region 105 and the channel structures 140 to cross the active region 105 and the channel structures 140, to extend in one direction, for example, the Y-direction. Channel regions of transistors may be formed in the active region 105 and the channel structures 140, crossing the gate structure 160. The gate structure 160 may include a gate electrode layer 163, a gate dielectric layer 162 between the gate electrode layer 163 and the plurality of channel layers 141, 142, and 143, spacer layers 161 on side surfaces of the gate electrode layer 163, and a gate capping layer 164 on an upper surface of the gate electrode layer 163.

The gate dielectric layer 162 may be disposed between the active region 105 and the gate electrode layer 163, and between the channel structure 140 and the gate electrode layer 163, and may be arranged to cover at least a portion of surfaces of the gate electrode layer 163. For example, the gate dielectric layer 162 may be disposed to surround all surfaces except for an uppermost surface of the gate electrode layer 163. The gate dielectric layer 162 may extend between the gate electrode layer 163 and the spacer layers 161, but embodiments of the present inventive disclosure are not limited thereto. The gate dielectric layer 162 may include an oxide, a nitride, or a high-κ material. The high-κ material may refer to a dielectric material having a higher dielectric constant than that of a silicon oxide film ($SiO_2$). The high dielectric constant material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide (HfSixOy), lanthanum oxide (La2O3), lanthanum aluminum oxide (LaAlxOy), lanthanum hafnium oxide (LaHfxOy), hafnium aluminum oxide (HfAlxOy), or praseodymium oxide (Pr2O3).

The gate electrode layer 163 may be disposed on the active region 105 to fill spaces between the plurality of channel layers 141, 142, and 143, and extend to an upper portion of the channel structure 140. The gate electrode layer 163 may be spaced apart from the plurality of channel layers 141, 142, and 143 by the gate dielectric layer 162. The gate electrode layer 163 may include a conductive material. For example, the conductive material may include a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon.

The gate electrode layer 163 may be formed of two or more multi-layers. The spacer layers 161 may be disposed on both side surfaces of the gate electrode layer 163. The spacer layers 161 may insulate the source/drain region 150 and the gate electrode layer 163. The spacer layers 161 may have a multilayer structure according to embodiments. The spacer layers 161 may include at least one of an oxide, a nitride, an oxynitride, or a low-κ dielectric.

The gate capping layer 164 may be disposed on the gate electrode layer 163. The gate capping layer 164 may be disposed to extend in a second direction, for example, the Y-direction along the upper surface of the gate electrode layer 163. Side surfaces of the gate capping layer 164 may be surrounded by spacer layers 161. An upper surface of the gate capping layer 164 may be substantially coplanar with upper surfaces of the spacer layers 161, but embodiments of the present disclosure are not limited thereto. The gate capping layer 164 may be formed of an oxide, a nitride, or an oxynitride, and specifically, may include at least one of SiO, SiN, SiCN, SiOC, SiON, or SiOCN.

Although not illustrated, the semiconductor device 100 may further include internal spacer layers. The internal spacer layers may be disposed in parallel with the gate electrode layer 163 between the channel structures 140. Under the third channel layer 143, the gate electrode layer 163 may be spaced apart from the source/drain region 150 by the internal spacer layers, to be electrically isolated from each other. The internal spacer layers may have a shape in which a side surface facing the gate electrode layer 163 may be convexly rounded inwardly toward the gate electrode layer 163, but embodiments of the present disclosure are not limited thereto. The internal spacer layers may be formed of an oxide, a nitride, or an oxynitride, and in particular, a low-K film.

The internal spacer layers may be formed of the same material as the spacer layers 161, but embodiments of the present disclosure are not limited thereto. For example, the internal spacer layers may include at least one of SiN, SiCN, SiOCN, SiBCN, or SiBN. The internal spacer layers may be applied to other embodiments as well.

The interlayer insulating layers 191 and 192 may include a first interlayer insulating layer 191 disposed to cover the source/drain region 150, and a second interlayer insulating layer 192 on the first interlayer insulating layer 191. The first interlayer insulating layer 191 may be disposed to cover side surfaces of the gate structure 160 and a side surface of the first contact structure 180. The second interlayer insulating layer 192 may be disposed to cover a side surface of the gate contact structure 200 and a side surface of the second contact structure 190. The interlayer insulating layers 191 and 192 may include, for example, at least one of an oxide, a nitride, an oxynitride, or a low-K dielectric.

The first contact structure 180 may pass through the first interlayer insulating layer 191 between the gate structures 160 in a vertical direction, for example, the Z-direction. The first contact structure 180 may be connected to the source/drain region 150. The first contact structure 180 may apply an electrical signal to the source/drain region 150. The first contact structure 180 may be disposed on the source/drain region 150, and may be disposed to have a longer length than the source/drain region 150 in the Y-direction, in some embodiments. The first contact structure 180 may have an inclined side surface in which a width of a lower portion becomes narrower than a width of an upper portion according to an aspect ratio, but embodiments of the present disclosure are not limited thereto. The first contact structure 180 may be disposed to recess the source/drain region 150 to a predetermined depth. The first contact structures 180 may include a metal-semiconductor compound layer 182 disposed on a lower end, a first barrier layer 184 disposed along sidewalls, and a plug conductive layer 186.

The metal-semiconductor compound layer 182 may be disposed in the recess region of the source/drain region 150. The metal-semiconductor compound layer 182 may include, for example, metal silicide, metal germanide, or metal silicide-germanide. The metal-semiconductor compound layer 182 and a first layer 202 of the gate contact structure 200 may be formed of different materials.

The first barrier layer 184 may surround a lower surface and side surfaces of the plug conductive layer 186. The first barrier layer 184 may directly contact the metal-semiconductor compound layer 182. The first barrier layer 184 may conformally cover an inner wall of a contact hole. The first barrier layer 184 may include, for example, a metal nitride such as a titanium nitride layer (TiN), a tantalum nitride layer (TaN), or a tungsten nitride layer (WN).

The plug conductive layer 186 may be disposed to fill a space between inner walls of the first barrier layer 184. The plug conductive layer 186 may include a metal material, for example, at least one of aluminum (Al), copper (Cu), tungsten (W), cobalt (Co), ruthenium (Ru), or molybdenum (Mo).

The second contact structure 190 may be disposed on the first contact structure 180, to be connected to the first contact structure 180. The second contact structure 190 may pass through the second interlayer insulating layer 192 in the vertical direction, for example, in the Z-direction. The second contact structure 190 may include a second barrier layer 194 and a conductive via layer 196 on the second barrier layer 194.

The second barrier layer 194 may surround a lower surface and side surfaces of the conductive via layer 196. The second barrier layer 194 may directly contact the plug conductive layer 186. The second barrier layer 194 may conformally cover an inner wall of a contact hole. The second barrier layer 194 may include, for example, a metal nitride such as a titanium nitride layer (TiN), a tantalum nitride layer (TaN), or a tungsten nitride layer (WN).

The conductive via layer 196 may be disposed to fill a space between inner walls of the second barrier layer 194. The conductive via layer 196 may include a metal material, for example, at least one of aluminum (Al), copper (Cu), tungsten (W), cobalt (Co), ruthenium (Ru), or molybdenum (Mo). An upper surface of the conductive via layer 196 may be coplanar with an upper surface of the gate contact structure 200.

The gate contact structure 200 may pass through the gate capping layer 164 in the vertical direction, for example, the Z-direction, to be connected to the gate electrode layer 163. The gate contact structure 200 may pass through the second interlayer insulating layer 192 on the gate electrode layer 163, to be connected to the gate electrode layer 163. The gate contact structure 200 may include a first layer 202, a second layer 204 disposed on the first layer 202, and a third layer 206 disposed on the second layer 204. The gate contact structure 200 may include a metal material, different from that of the first contact structure 180.

Figure 6A:
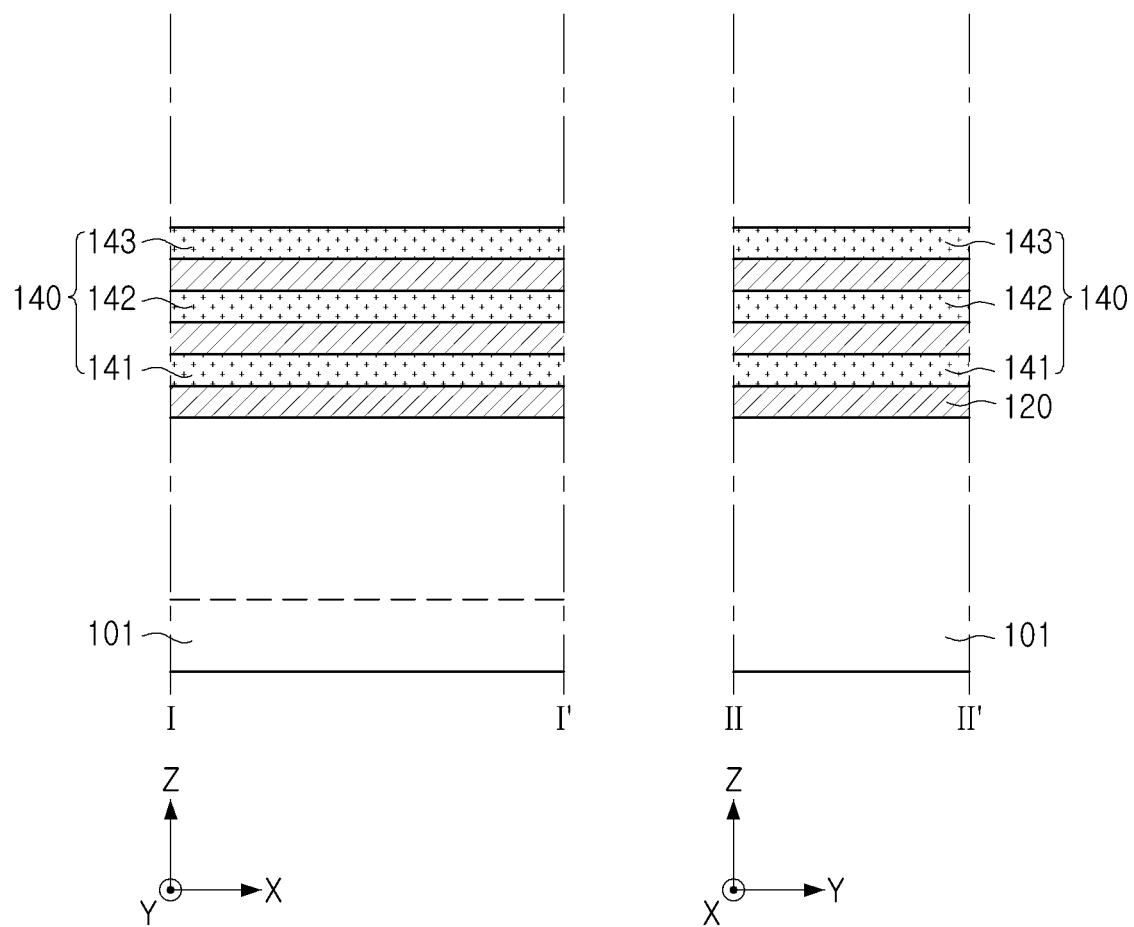
FIGS. 6A to 6K are cross-sectional views illustrating a process sequence in a method of manufacturing a semiconductor device according to example embodiments.
Figure 6B:
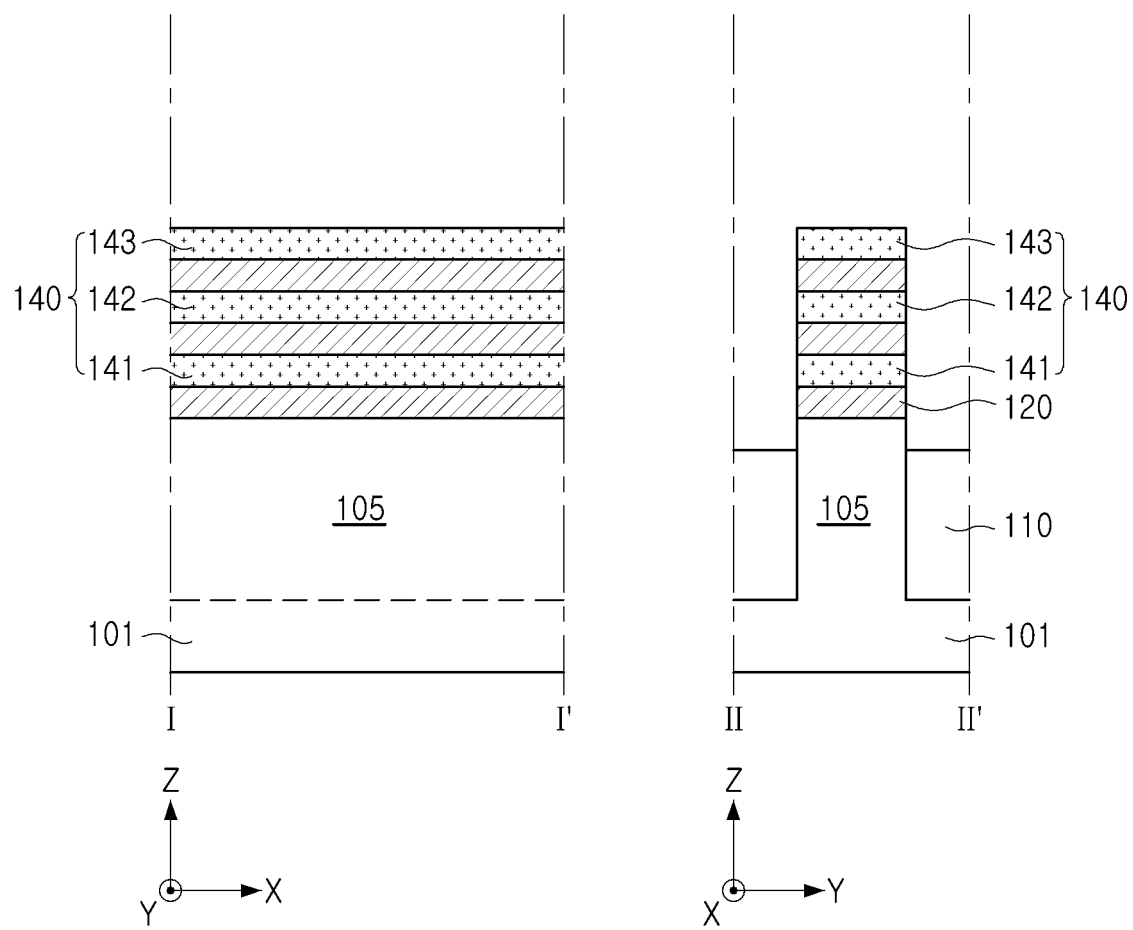
Figure 6C:
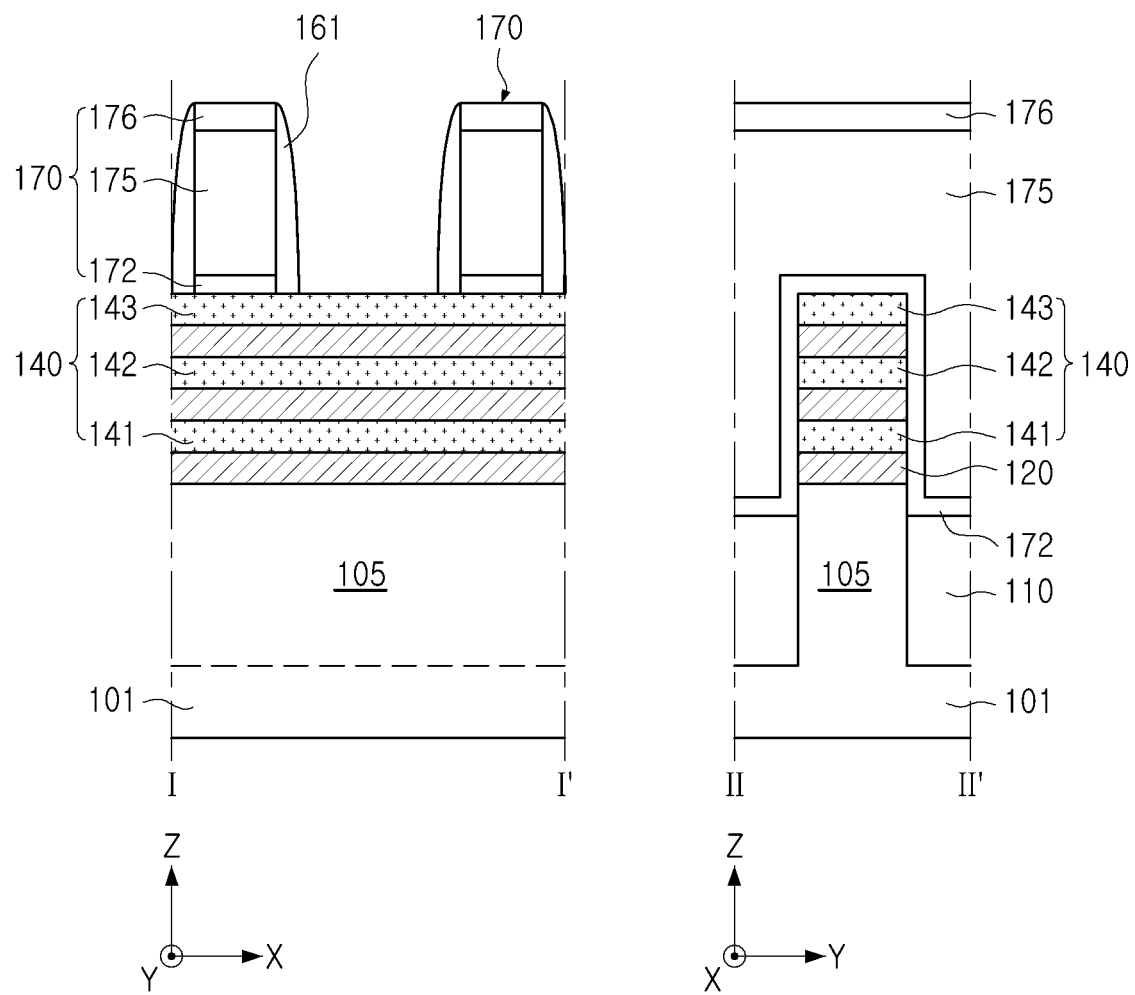
Figure 6D:
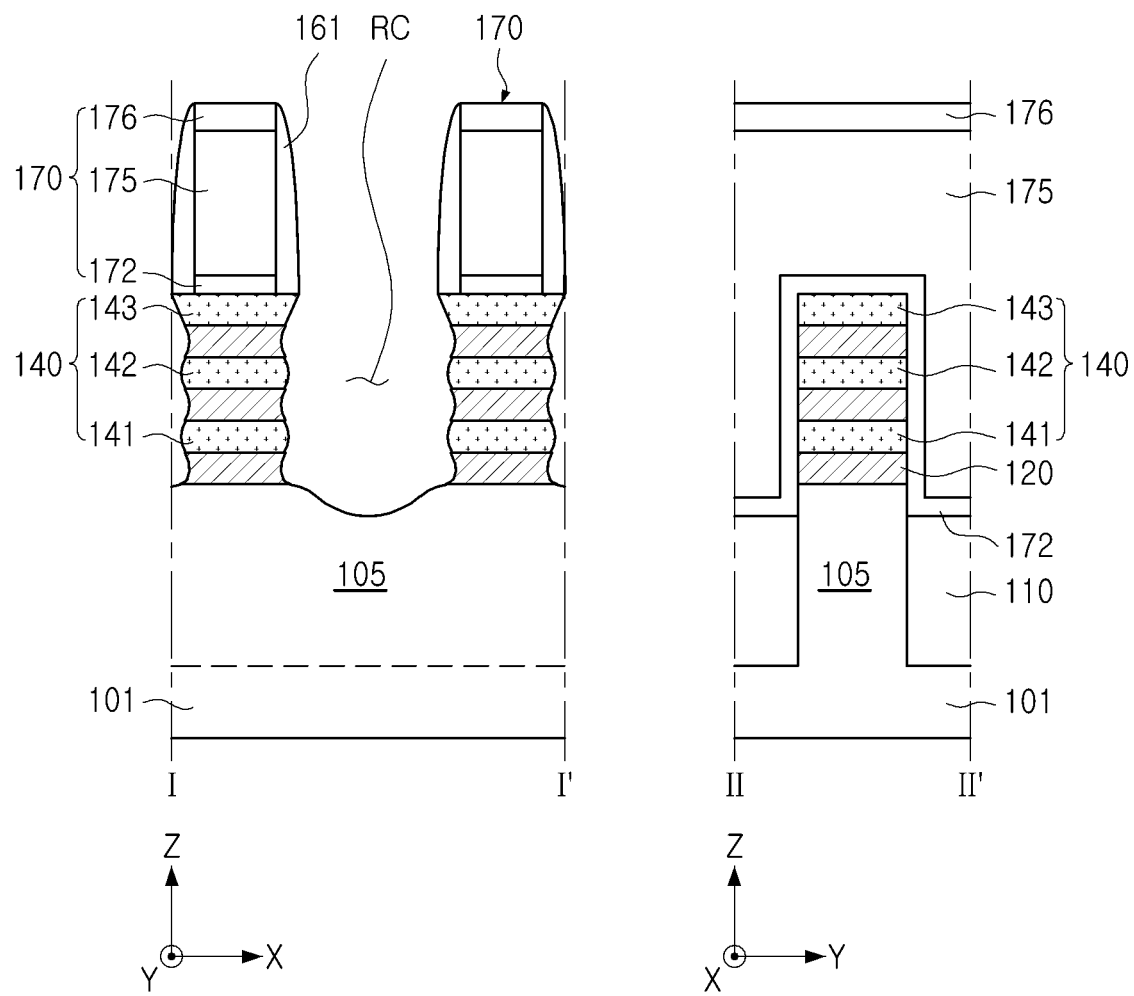
Figure 6E:
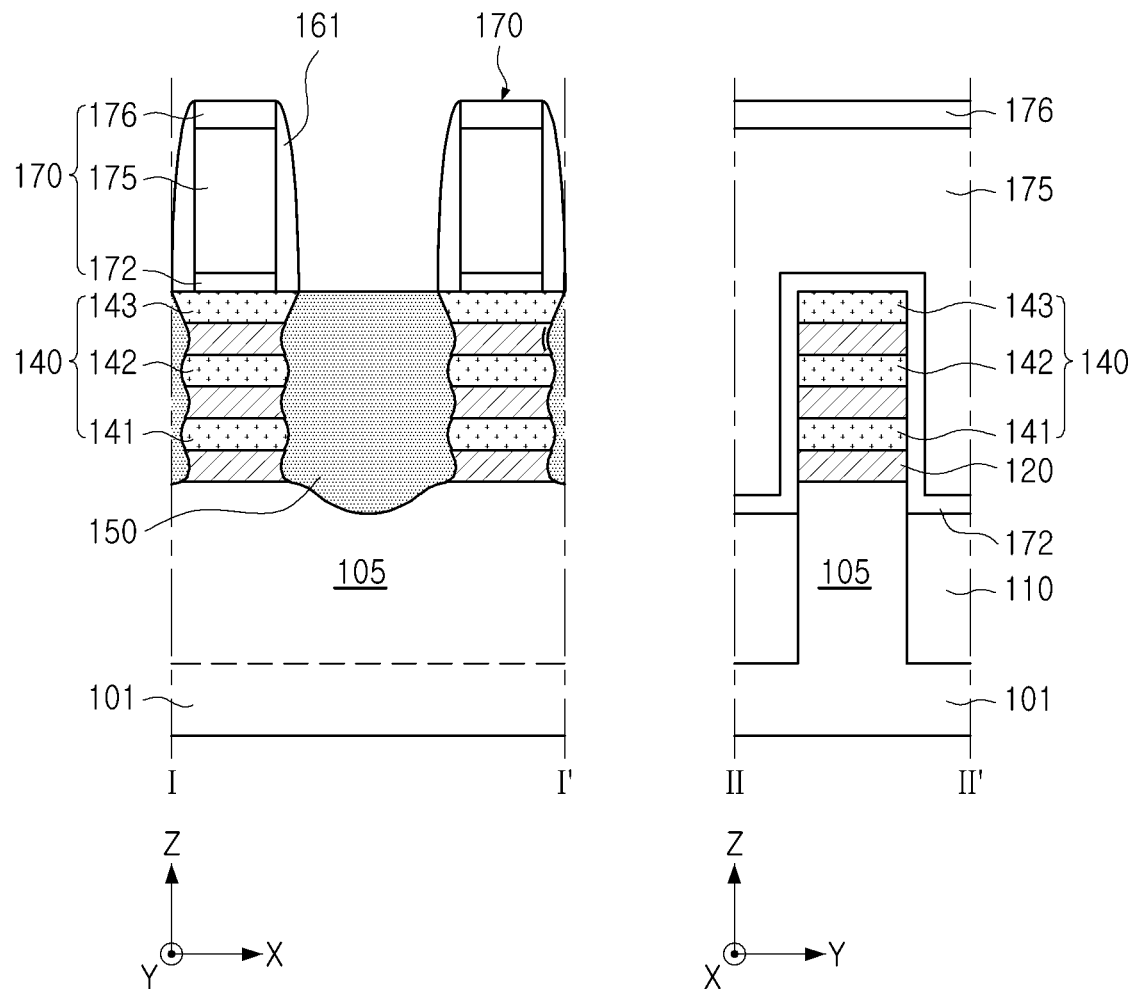
Figure 6F:
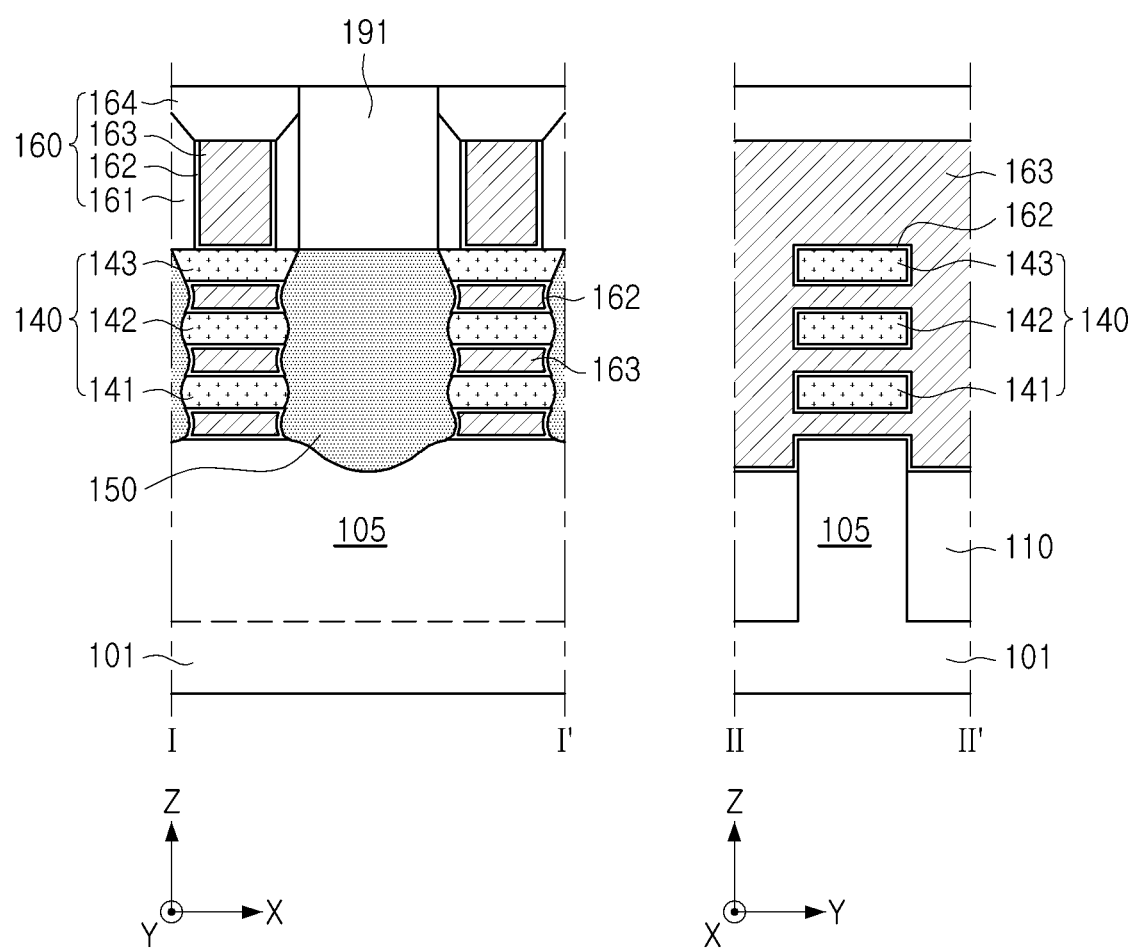
Figure 6G:
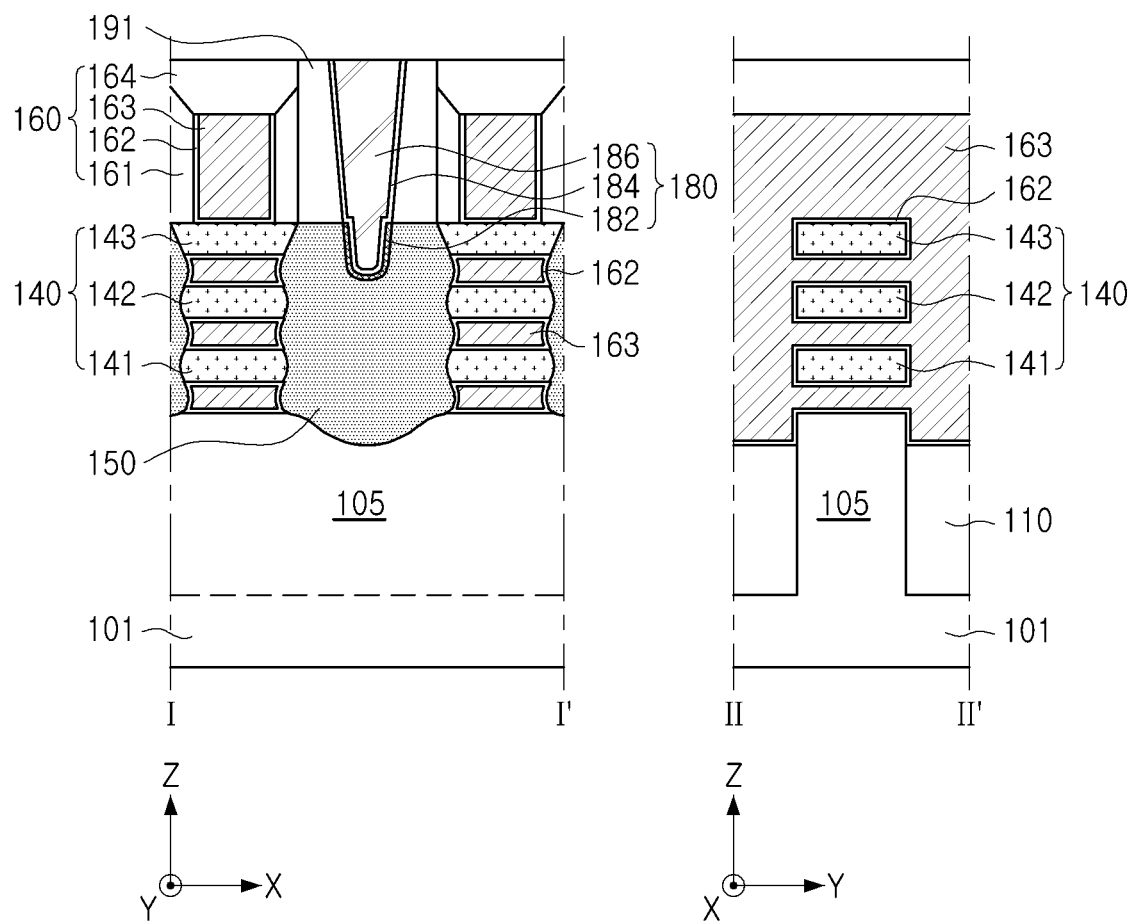
Figure 6H:
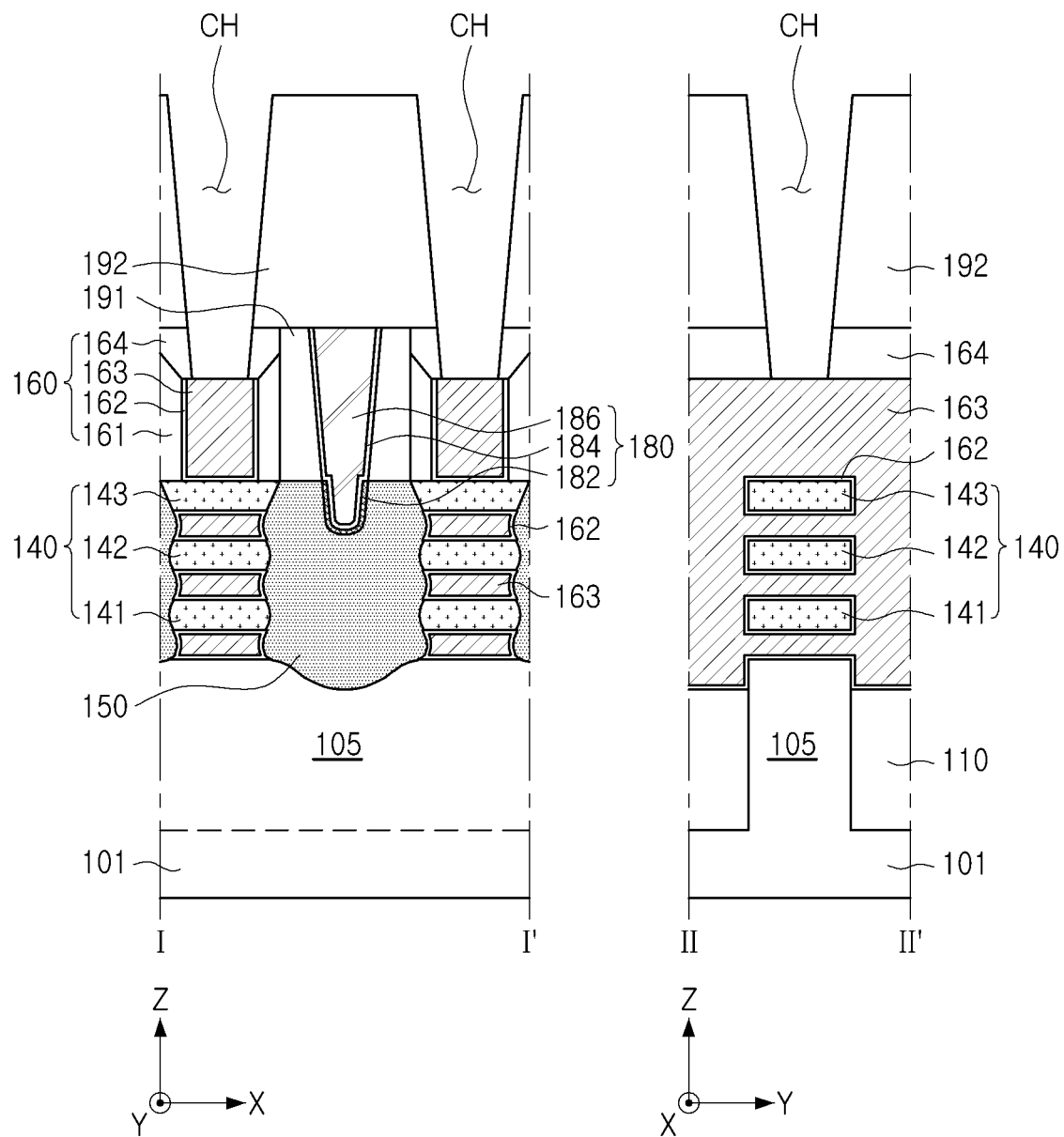
Figure 6I:
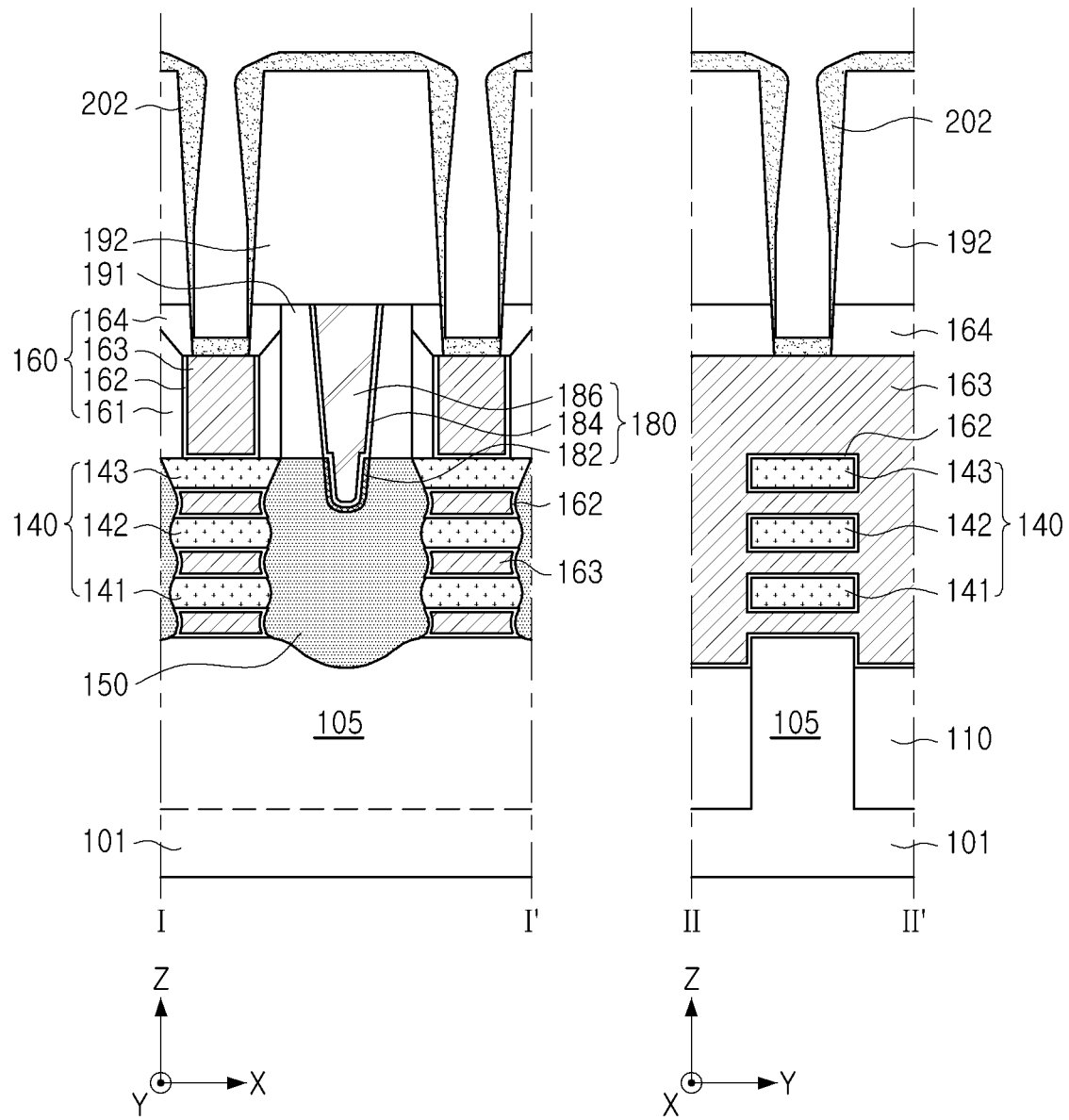

The first layer 202 may be disposed to cover an upper surface of the gate electrode layer 163, and to cover inner walls of second contact holes CH (refer to FIGS. 6H and 6I). The first layer 202 may be in direct contact with the upper surface of the gate electrode layer 163 and the second layer 204. The first layer 202 may be a layer formed by a physical vapor deposition (PVD) process. The first layer 202 formed by the PVD process may have excellent adhesion to the second interlayer insulating layer 192.

As illustrated in FIG. 2B, the first layer 202 may have a first thickness D2 on a lower surface of the second layer 204, and may have a second thickness D1, less than the first thickness D2, on a side surface of the second layer 204. The first layer 202 may have a third thickness in an upper portion of the side surface of the second layer 204, and a fourth thickness, less than the third thickness, in a lower portion of the side surface of the second layer 204. For example, since the first layer 202 may be formed by a PVD process, a lower portion of a side surface of the first layer 202 may be formed to be thinner than an upper portion of the side surface of the first layer 202. For example, a lateral thickness of the first layer 202 may decrease from the upper portion of the side surface of the first layer 202 to the lower portion of the side surface of the first layer 202. A width L1 of the gate contact structure 200 in the first direction (the X-direction) may be the same as or smaller than a width L2 of the gate electrode layer 163 in the first direction (the X-direction), but embodiments of the present disclosure are not limited thereto. A lateral thickness D3 of the second layer 204 may be smaller than a width of the third layer 206 in the first direction (the X-direction).

The first layer 202 may include a metallic material, for example, at least one of aluminum (Al), copper (Cu), tungsten (W), cobalt (Co), ruthenium (Ru), or molybdenum (Mo). The first layer 202 may replace a barrier metal layer (Ti/TiN) having relatively high resistance, to reduce resistance of the gate contact structure 200.

The second layer 204 may be disposed to cover an inner wall or an inner side surface of the first layer 202. The second layer 204 may be a nucleation layer. The second layer 204 may be formed using a chemical vapor deposition (CVD) process. The second layer 204 may include first impurities. For example, the first impurities may include at least one of boron (B) or silicon (Si). The first impurities may be due to diborane ($B_2H_6$) and/or silane ($SiH_4$), which may be reactive gases used when the second layer 204 is formed. The second layer 204 may be formed using tungsten hexafluoride ($WF_6$), and thus may further include fluorine (F) as second impurities. The second layer 204 may be spaced apart from the second interlayer insulating layer 192 and the gate electrode layer 163 by the first layer 202. The second layer 204 may be disposed substantially conformally along the inner side surface of the first layer 202. The thickness D3 of the second layer 204 may be about 1 nm to about 3 nm. In the present specification, the term "substantially conformally" is not limited to completely uniform, but also includes slight variations from uniform. Such slight variations may include, for example, variations due to a manufacturing process, though the term is not limited to such. Additionally, "conformally" and "substantially conformally" may be used interchangeably and given the same meaning.

The second layer 204 may prevent occurrence of defects when an aspect ratio AR of the gate contact structure 200 is 3:1 or more during a process of forming the gate contact structure 200. For example, when the aspect ratio AR of the gate contact structure 200 is 5:1 and a PVD process for forming the first layer 202 is performed, a void may be formed in the gate contact structure 200 in a subsequent process, as a thickness of the lower portion of the side surface of the first layer 202 decreases. For example, the width L1 of the gate contact structure 200 in the first direction (the X-direction) may be in the range of about 10 nm to about nm, and during the process of forming the gate contact structure 200, a depth of a contact hole in which the first layer 202 is formed, in the Z-direction, (refer to a second contact hole CH of FIG. 6H) may be in a range of about 50 nm to about 75 nm. The second layer 204 may be a layer formed to reinforce a thickness of the lower portion of the side surface of the first layer 202, to prevent formation of a void in the gate contact structure 200. Therefore, resistance of the gate contact structure 200 may be lowered, and a semiconductor device having improved electrical characteristics may be provided.

The third layer 206 may be disposed on the second layer 204. The third layer 206 may be disposed to fill a space between inner side walls or inner side surfaces of the second layer 204. A shape of a lower surface of the third layer 206 may be substantially flat, but is not limited to the shape illustrated in FIG. 2B. The third layer 206 may be formed using a CVD process. The first layer 202 may play a role as a barrier preventing diffusion of elemental fluorine (F) from the second layer 204 and the third layer 206 formed using a CVD process into the second interlayer insulating layer 192. The third layer 206 may include the second impurities. For example, the third layer 206 may include fluorine (F). Since the third layer 206 may be formed by using tungsten hexafluoride ($WF_6$), the elemental fluorine (F) may be left from a precursor material of tungsten (W) for forming the third layer 206. The first layer 202 may not contain fluorine (F) because it may be formed by a PVD process unlike the third layer 206, or may contain fluorine (F) in a lower concentration than that of the second layer 204 and the third layer 206, since the elemental fluorine (F) of the second layer 204 and the third layer 206 may diffuse into the first layer 202.

The first to third layers 202, 204, and 206 may include the same metal material. For example, the first to third layers 202, 204, and 206 may include, but not limited to, tungsten (W).

Figure 3:
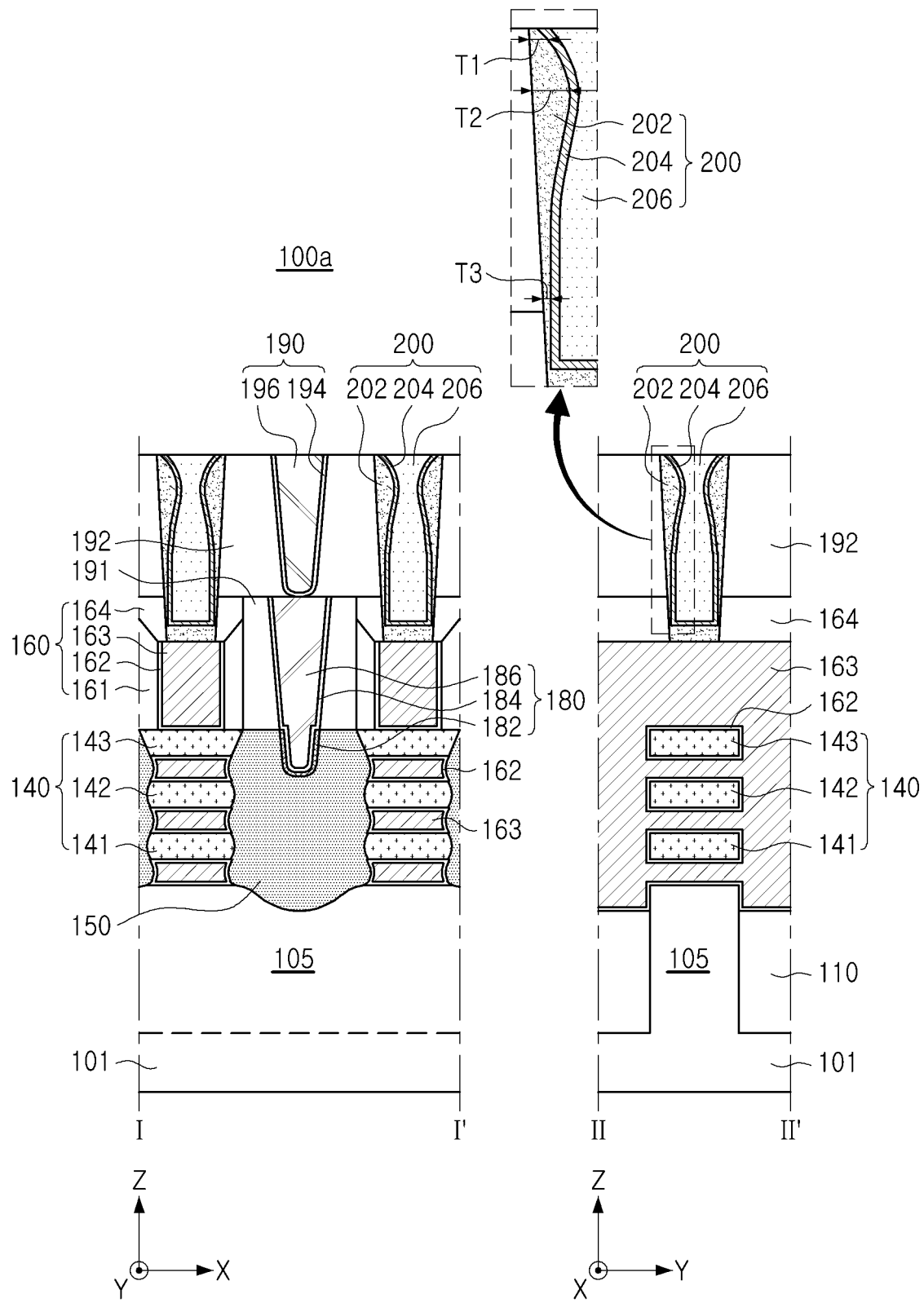
FIGS. 3 and 4A are cross-sectional views illustrating semiconductor devices according to example embodiments.
Figure 4A:
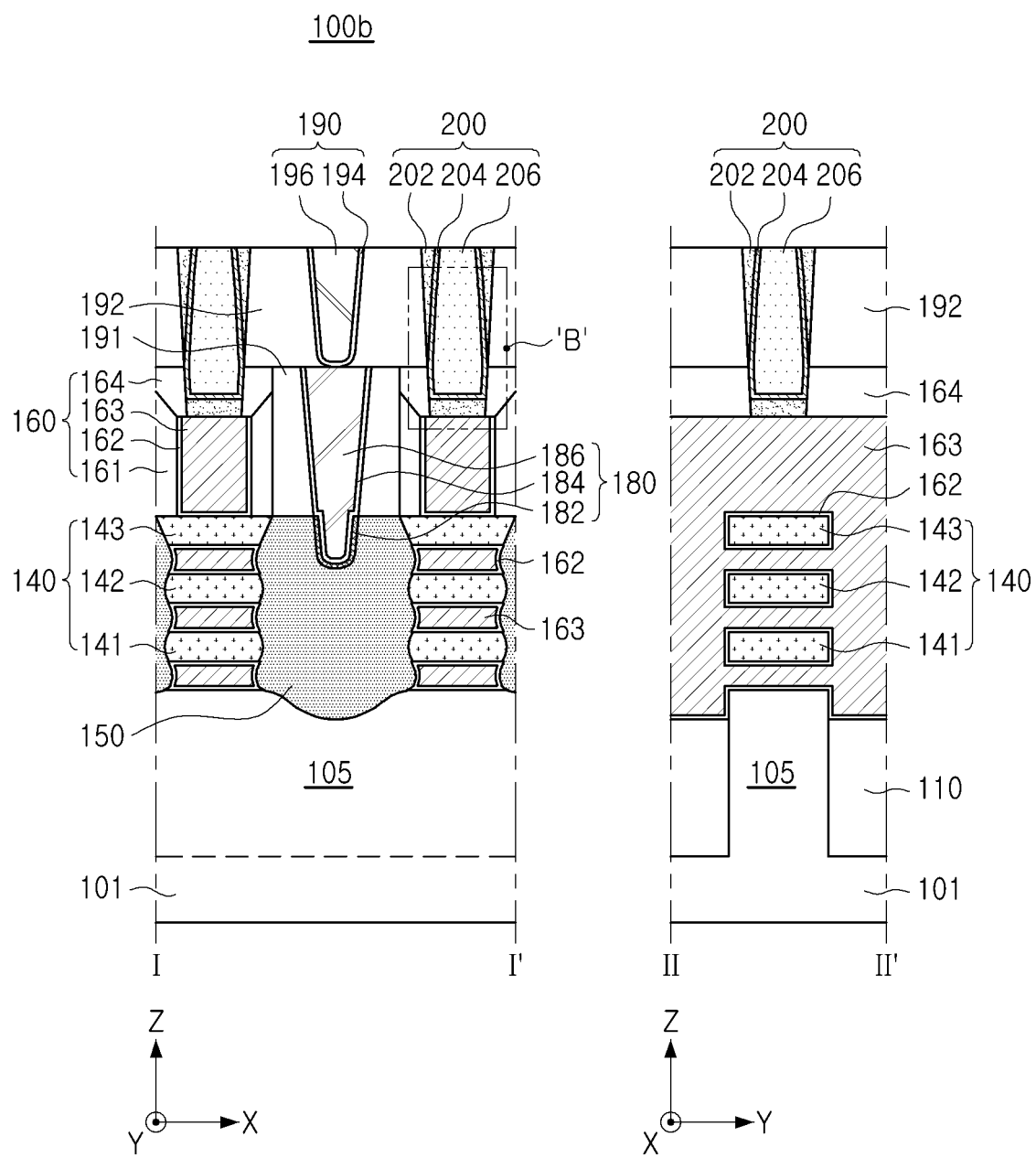
Figure 5:
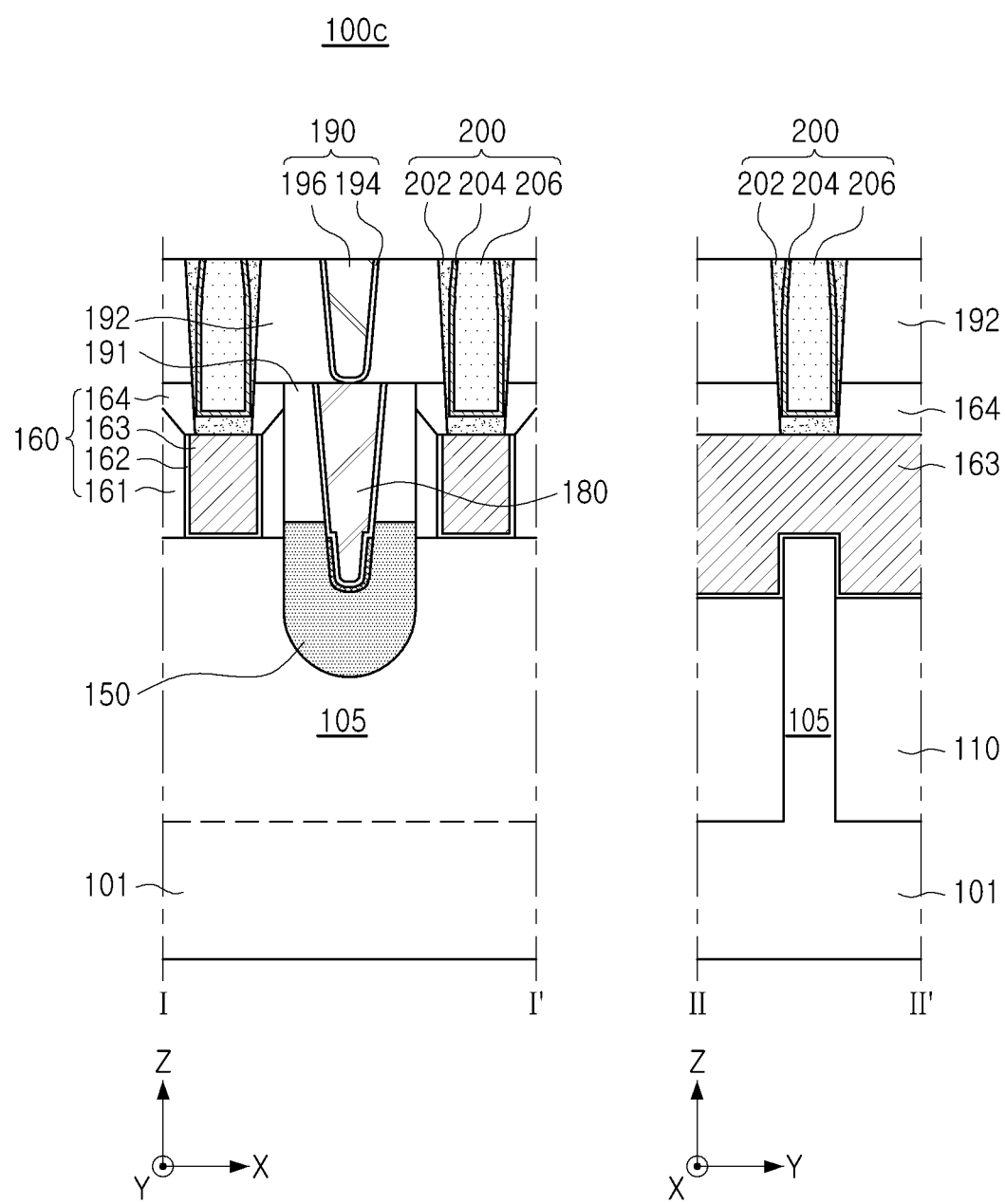
FIG. 5 is a cross-sectional view illustrating a semiconductor device according to example embodiments.

FIGS. 3, 4A, and 5 are cross-sectional views illustrating semiconductor devices 100a, 100b, and 100c according to example embodiments.

Figure 4B:
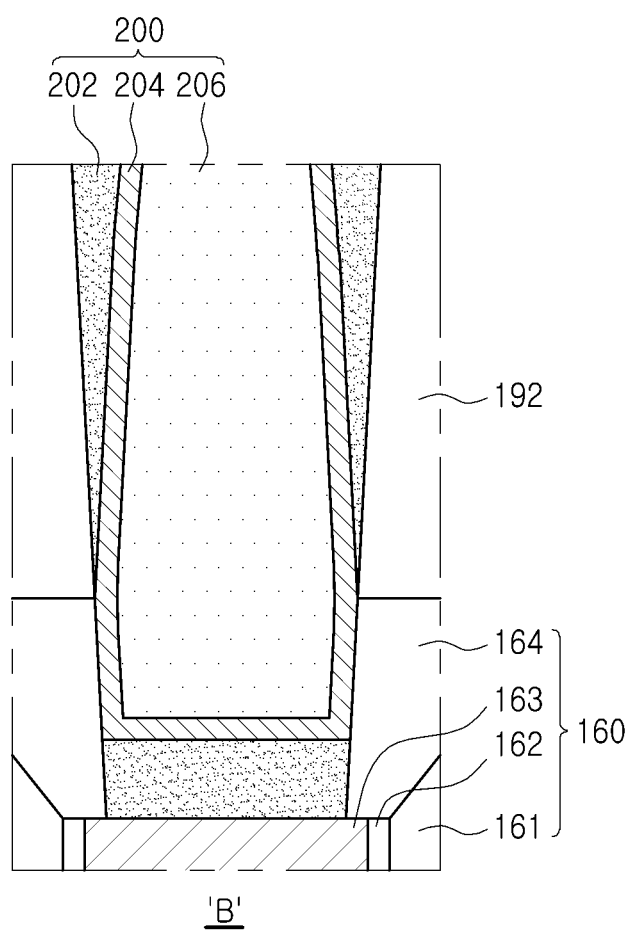
FIG. 4B is a partially enlarged view illustrating a region of a semiconductor device according to example embodiments.

FIG. 4B is a partially enlarged view illustrating a region of a semiconductor device according to example embodiments. FIG. 4B illustrates an enlarged view of portion 'B' of FIG. 4A.

Referring to FIGS. 3 to 5, the same reference numerals as those of FIG. 2A indicate corresponding components, and descriptions overlapping the above description will be omitted.

Referring to FIG. 3, in a semiconductor device 100a, a side structure of a first layer 202 may be different from that of the embodiment of FIG. 2A, unlike the embodiment of FIG. 2A. For example, a thickness of a side surface of the first layer 202 may gradually increase from a lowermost portion of the side surface to an upper portion of the side surface of the first layer 202, and may then decrease again from the upper portion to an uppermost portion of the first layer 202. For example, a third lateral thickness T3 in the lower portion may be smaller than a second lateral thickness T2 above the same, and a first lateral thickness T1 in the upper portion may be smaller than the second lateral thickness T2.

The first layer 202 of the gate contact structure 200 may be a layer formed by performing a PVD process, and the second layer 204 and the third layer 206 may be a layer formed by performing at least one of a selective deposition process or a CVD process. Since the first layer 202 may be formed by performing a PVD process, the third lateral thickness T3 of the first layer 202 may be smaller than the first lateral thickness T1 and the second lateral thickness T2. In the semiconductor device 100a, a barrier metal layer (Ti/TiN) having high resistance may be replaced with the first layer 202 including tungsten (W) to reduce resistance of the gate contact structure 200.

Referring to FIGS. 4A and 4B, in a semiconductor device 100b, a lower portion of a side surface of a second layer 204 may directly contact at least one of a gate capping layer 164 or a second interlayer insulating layer 192. When an aspect ratio AR of a gate contact structure 200 is 3:1 or more during a process of forming the gate contact structure 200, for example, when the aspect ratio AR is 5:1 during the process of forming the gate contact structure 200, there may be a region in which a first layer 202 is not formed in lower portions of side surfaces of second contact holes CH. Therefore, in the first layer 202, a side surface may be separated from a lower surface. For example, the first layer 202 may not extend along inner walls of the second contact holes CH, but the first layer 202 may not be formed on the lower portions of the side surfaces of the second contact holes CH.

The first layer 202 of the gate contact structure 200 may be formed by performing a PVD process, and the second layer 204 and a third layer 206 may be formed by performing at least one of a selective deposition process or a CVD process. A barrier metal layer (Ti/TiN) having high resistance may be replaced with the first layer 202 including tungsten (W) to reduce resistance of the gate contact structure 200.

Referring to FIG. 5, a semiconductor device 100c may include a substrate 101, an active region 105, a device isolation layer 110, a source/drain region 150, gate structures 160, a first contact structure 180, a second contact structure 190, a gate contact structure 200, and interlayer insulating layers 191 and 192. The semiconductor device 100c may include a FinFET device in which the active region 105 is a transistor having a fin structure. The FinFET device may include a transistor in which an active region 105 and gate structures 160, crossing each other, are mainly disposed. For example, the transistors may be NMOS transistors or PMOS transistors.

The source/drain regions 150 may be disposed on both sides of the gate structures 160, on recess regions in which the active region 105 is recessed. The recess region may extend in the X-direction between the gate structures 160, and may have inner side walls located on both ends in the X-direction, and a bottom surface between the inner side walls. The source/drain region 150 may serve as a source region or a drain region of the transistors. As illustrated in FIG. 5, an upper surface of the source/drain region 150 may be similar to lower surfaces of the gate structures 160 or located on a height level higher than a level of the lower surfaces of the gate structures 160. Relative heights of the source/drain region 150 and the gate structures 160 may be variously changed according to embodiments. For example, the source/drain region 150 may have an elevated source/drain shape in which the upper surface of the source/drain region 150 is located higher than the lower surfaces of the gate structures 160, in particular, a gate electrode layer 163, but embodiments of the present disclosure are not limited thereto.

FIGS. 6A to 6K are cross-sectional views illustrating a process sequence in a method of manufacturing a semiconductor device 100 according to example embodiments. FIGS. 6A to 6K illustrate an embodiment of a method of manufacturing the semiconductor device 100 of FIGS. 1 to 2A, and illustrate cross-sections corresponding to FIG. 2A.

Referring to FIG. 6A, sacrificial layers 120 and a plurality of channel layers 141, 142, and 143 may be alternately stacked on a substrate 101.

The sacrificial layers 120 may be replaced with a gate dielectric layer 162 and a gate electrode layer 163, as illustrated in FIGS. 2A and 2B, by a subsequent process. The sacrificial layers 120 may be formed of a material having etch selectivity with respect to the plurality of channel layers 141, 142, and 143. The plurality of channel layers 141, 142, and 143 may include a material, different from that of the sacrificial layers 120. In an example embodiment, the plurality of channel layers 141, 142, and 142 may include silicon (Si), and the sacrificial layers 120 may include silicon germanium (SiGe).

The sacrificial layers 120 and the plurality of channel layers 141, 142, and 143 may be formed by performing an epitaxial growth process using the substrate 101 as a seed. The sacrificial layers 120 and the plurality of channel layers 141, 142, and 143 may have a thickness of about 1 Å to 100 nm, respectively. The number of layers of the plurality of channel layers 141, 142, and 143 alternately stacked with the sacrificial layer 120 may be variously changed in embodiments.

Referring to FIG. 6B, a stack structure of the sacrificial layers 120 and the plurality of channel layers 141, 142, and 143, and the substrate 101 may be partially removed to form active structures.

The active structure may include the sacrificial layers 120 and the plurality of channel layers 141, 142, and 143, alternately stacked with each other, and may further include an active region 105 in which an upper surface of the substrate 101 is formed to protrude by removing a portion of the substrate 101. The active structures may be formed in a linear shape extending in one direction, for example, the X-direction, and may be disposed to be spaced apart from each other in the Y-direction.

Device isolation layers 110 may be formed in a region from which a portion of the substrate 101 is removed by burying an insulating material and then recessing the active region 105 to protrude. Upper surfaces of the device isolation layers 110 may be formed to be lower than an upper surface of the active region 105.

Referring to FIG. 6C, sacrificial gate structures 170 and spacer layers 161 may be formed on the active structures.

The sacrificial gate structures 170 may be sacrificial structures formed in a region in which a gate dielectric layer 162 and a gate electrode layer 163 are disposed on the channel structure 140 by a subsequent process, as illustrated in FIGS. 2A and 2B. The sacrificial gate structures 170 may include first and second sacrificial gate layers 172 and 175 and a mask pattern layer 176, sequentially stacked. The first and second sacrificial gate layers 172 and 175 may be patterned using the mask pattern layer 176. The first and second sacrificial gate layers 172 and 175 may be an insulating layer and a conductive layer, respectively. For example, the first sacrificial gate layer 172 may include silicon oxide, and the second sacrificial gate layer 175 may include polysilicon. The mask pattern layer 176 may include silicon nitride. The sacrificial gate structures 170 may have a linear shape crossing the active structures and extending in one direction. The sacrificial gate structures 170 may extend, for example, in the Y-direction, and may be disposed to be spaced apart from each other in the X-direction.

The spacer layers 161 may be formed on both sidewalls of the sacrificial gate structures 170. The spacer layers 161 may be prepared by forming a film having a uniform thickness along upper and side surfaces of the sacrificial gate structures 170 and the active structures, and then performing anisotropic etching. The spacer layers 161 may be formed of a low-κ material, and may include, for example, at least one of SiO, SiN, SiCN, SiOC, SiON, or SiOCN.

Referring to FIG. 6D, channel structures 140 may be formed by removing exposed sacrificial layers 120 and the plurality of channel layers 141, 142, and 143 to form a recess region RC between the sacrificial gate structures 170.

The exposed sacrificial layers 120 and the plurality of channel layers 141, 142, and 143 may be removed by using the sacrificial gate structures 170 and the spacer layers 161 as masks. Remaining sacrificial layers 120 may be selectively etched with respect to the channel structures 140 by, for example, a wet etching process, and removed to a predetermined depth from a side surface in the X-direction, to have inwardly concave side surfaces. Remaining channel layers 141, 142, and 143 may have side surfaces etched in the X-direction, to have outwardly convex side surfaces. Shapes of the side surfaces of the sacrificial layers 120 and the plurality of channel layers 141, 142, and 143 are not limited to those illustrated. Side surfaces of the sacrificial layers 120 and the plurality of channel layers 141, 142, and 143 may be formed to be coplanar in a direction, perpendicular to the upper surface of the substrate 101.

Referring to FIG. 6E, a source/drain region 150 may be prepared by forming an epitaxial layer in the recess region RC.

The source/drain regions 150 may be formed by an appropriate epitaxial growth process. The source/drain region 150 may be formed by epitaxial growth, and may extend to contact the plurality of channel layers 141, 142, 143 and the sacrificial layers 120 in the recess region RC. A surface of the source/drain region 150 contacting the plurality of channel layers 141, 142, and 143 and the sacrificial layers 120 may have a wavy shape. The source/drain region 150 may include impurities by in-situ doping.

Referring to FIG. 6F, a first interlayer insulating layer 191 may be formed, the sacrificial layers 120 and the sacrificial gate structures 170 may be removed, and a gate structure 160 may be formed.

The first interlayer insulating layer 191 may be prepared by forming an insulating layer covering the sacrificial gate structures 170 and the source/drain regions 150, and performing a planarization process.

The sacrificial layers 120 and the sacrificial gate structures 170 may be selectively removed with respect to the spacer layers 161, the first interlayer insulating layer 191, and the plurality of channel layers 141, 142, and 143. For example, when the sacrificial layers 120 include silicon germanium (SiGe) and the plurality of channel layers 141, 142, and 143 include silicon (Si), the sacrificial layers 120 may be selectively removed by performing a wet etching process using peracetic acid as an etchant.

The sacrificial gate structures 170 may be removed to partially expose the active region 105 between the spacer layers 161.

The gate structure 160 may be prepared by forming a gate dielectric layer 162, a gate electrode layer 163, and a gate capping layer 164 in a region from which the sacrificial gate structures 170 are removed. The gate dielectric layer 162 may be formed to conformally cover upper and side surfaces of the active region 105 and inner walls of the spacer layers 161. After partially removing an upper portion of the gate electrode layer 163 to a predetermined depth, the gate capping layer 164 may be formed.

Referring to FIG. 6G, a first contact structure 180 may be formed.

First, first contact holes exposing the source/drain regions 150 may be formed by patterning the first interlayer insulating layer 191. Lower surfaces of the first contact holes may be recessed into the source/drain region 150.

Next, after depositing a material forming a first barrier layer 184, a process such as a silicide process may be performed to form a metal-semiconductor compound layer 182 on bottom surfaces of the first contact holes.

Next, a conductive material may be deposited to fill the first contact holes, to form a plug conductive layer 186. In this operation, the first contact structure 180 including the metal-semiconductor compound layer 182, the first barrier layer 184, and the plug conductive layer 186 may be formed. A lower end of the metal-semiconductor compound layer 182 may be located on a level lower than upper ends of the plurality of channel layers 141, 142, and 143. A shape and an arrangement of the first contact structure 180 are not limited thereto, and may be variously changed. In an example embodiment, the first barrier layer 184 may be formed by performing a tungsten (W) PVD process, and the plug conductive layer 186 may be formed by performing a CVD process.

Referring to FIG. 6H, a second interlayer insulating layer 192 and second contact holes CH may be formed.

First, the second interlayer insulating layer 192 may be prepared by forming an insulating layer covering the first interlayer insulating layer 191, the first contact structure 180, and the gate structure, and performing a planarization process.

Next, the second contact holes CH passing through the second interlayer insulating layer 192 and the gate capping layer 164 and exposing the gate electrode layer 163 may be formed. Lower surfaces of the second contact holes CH may be partially recessed into the gate electrode layer 163. A width of each of the lower surfaces of the second contact holes CH in the first direction (the X-direction) may be narrower than a width of the gate electrode layer 163 in the first direction (the X-direction), but embodiments of the present disclosure are not limited thereto.

Referring to FIG. 6I, a first layer 202 may be formed on the second contact holes CH.

The first layer 202 may be formed along inner side walls of the second contact holes CH. Since the first layer 202 is formed by a PVD process, when an aspect ratio AR of the gate contact structure 200 is 3:1 or more during a process of forming the gate contact structure 200, for example, when the aspect ratio AR of the gate contact structure 200 is 5:1 during the process of forming the gate contact structure 200, the first layer 202 may be formed to have a relatively thin thickness in lower portions of side surfaces of the second contact holes CH, but embodiments of the present disclosure are not limited thereto.

Figure 6J:
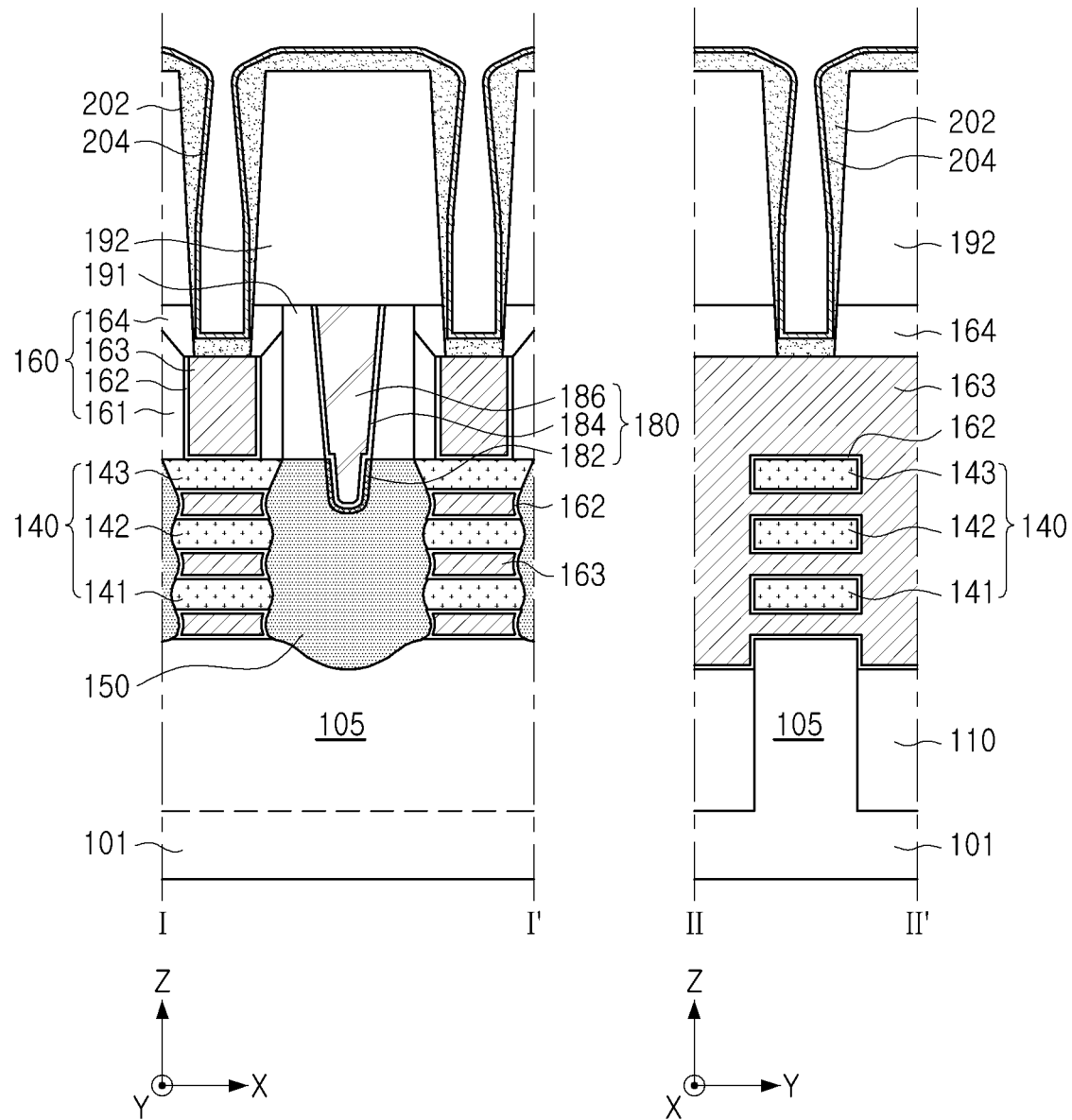

Referring to FIG. 6J, a second layer 204 on the first layer 202 may be formed. The second layer 204 may be a nucleation layer for forming a third layer 206. For example, the second layer 204 may be formed at a temperature ranging from about 300° C. to about 400° C. and a pressure ranging from about 3 Torr to about 7 Torr. According to an embodiment, the second layer 204 may be formed by reacting tungsten hexafluoride ($WF_6$) with at least one of diborane ($B_2H_6$) or silane ($SiH_4$) in a CVD process. The second layer 204 may include first impurities. For example, the first impurities may include at least one of boron (B) or silicon (Si). The first impurities may be generated due to diborane ($B_2H_6$) and/or silane ($SiH_4$), which may be reactive gases used when the second layer 204 is formed. The second layer 204 may be conformally formed along an inner wall of the first layer 202. Since the first layer 202 is thinly formed in lower portions of side surfaces of the second contact holes CH, the second layer 204 may serve to reinforce the same. Since the second layer 204 has a different forming material and has a different composition from the first layer 202 and the third layer 206, they may be actually distinguished through analysis of a transmission electron microscopy energy-dispersive X-ray spectroscopy (TEM-EDX) or the like, or may be distinguished through energy dispersive spectrometer (EDS) analysis or electron energy loss spectroscopy (EELS) analysis.

Figure 6K:
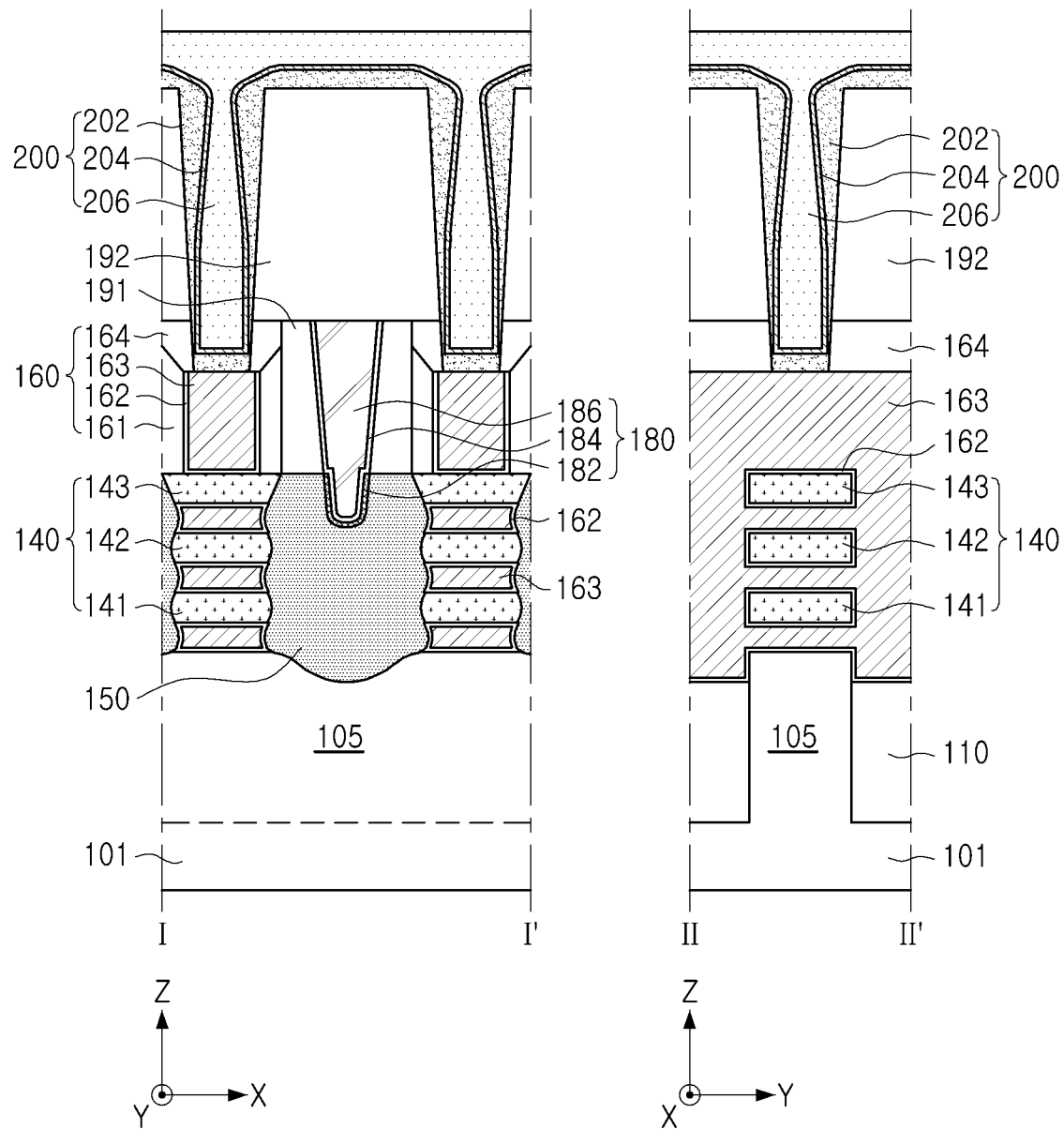

Referring to FIG. 6K, a third layer 206 may be formed on the second layer 204. The third layer 206 may be disposed to fill a space between inner walls of the second layer 204. The third layer 206 may be formed using a CVD process. In this case, the third layer 206 may be formed by changing only a pressure under conditions for forming the second layer 204. For example, the third layer 206 may be formed in a range of about 50 Torr to about 300 Torr. According to an embodiment, the third layer 206 may be formed by reacting tungsten hexafluoride ($WF_6$) with hydrogen ($H_2$) in a CVD process. Although the third layer 206 has the same precursor material including fluorine (F), as the second layer 204, a reaction gas may be different from gas used to form the second layer 204. According to an embodiment, when formed using a CVD process, the second layer 204 may serve as a barrier to prevent diffusion of fluorine (F) element.

Referring to FIG. 2A, a second contact structure 190 passing through the second interlayer insulating layer 192 may also be formed.

First, a process of planarizing the gate contact structure 200 and the second interlayer insulating layer 192 may be performed. Next, a third contact hole may be formed by patterning the second interlayer insulating layer 192, and a second barrier layer 194 and a conductive via layer 196 may be formed in the third contact hole. Therefore, the second contact structure 190 may be formed. A lowermost surface of the gate contact structure 200 may be located on a lower level than a level of a lowermost surface of the second contact structure 190.

A nucleation layer of a gate contact structure may include boron (B) or silicon (Si) to reduce resistance of the gate contact structure. Therefore, a semiconductor device having improved electrical characteristics may be provided.

While example embodiments have been particularly shown and described, it will be understood that various changes in form and details may be made without departing from the spirit and scope of the following claims.

What is claimed is:

1. A semiconductor device comprising:
   a substrate;
   an active region extending in a first direction on the substrate;
   a gate structure extending in a second direction on the substrate and crossing the active region, the gate structure comprising a gate electrode;
   a source/drain region provided on the active region on at least one side of the gate structure;
   an interlayer insulating layer covering the gate structure;
   a first contact structure connected to the source/drain region on at least one side of the gate structure; and
   a gate contact structure passing at least partially through the interlayer insulating layer and connected to the gate electrode,
   wherein the gate contact structure comprises:
   a first layer comprising a conductive material;
   a second layer provided on the first layer and comprising first impurities; and
   a third layer provided on the second layer and comprising second impurities that are different from the first impurities, and
   wherein the second layer is spaced apart from the interlayer insulating layer by the first layer.

2. The semiconductor device of claim 1, wherein the first impurities comprise at least one of boron (B) or silicon (Si).

3. The semiconductor device of claim 1, wherein the first layer has a first thickness on a lower surface of the second layer, and a second thickness on a side surface of the second layer, the second thickness being smaller than the first thickness.

4. The semiconductor device of claim 1, wherein the first layer has a third thickness in an upper portion of a side surface of the second layer, and a fourth thickness in a lower portion of the side surface of the second layer, the fourth thickness being smaller than the third thickness.

5. The semiconductor device of claim 1, wherein the second layer is disposed substantially conformally along an inner side surface of the first layer.

6. The semiconductor device of claim 1, wherein a lateral thickness of the second layer is smaller than a width of the third layer in the first direction.

7. The semiconductor device of claim 1, wherein a thickness of the second layer is in a range of about 1 nm to about 3 nm.

8. The semiconductor device of claim 1, wherein the second impurities comprise fluorine (F).

9. The semiconductor device of claim 1, further comprising a second contact structure provided on and connected to the first contact structure.

10. The semiconductor device of claim 1, wherein the first layer directly contacts the gate electrode, and the second layer is spaced apart from the gate electrode by the first layer.

11. The semiconductor device of claim 1, wherein a width of the gate contact structure in the first direction is equal to or smaller than a width of the gate electrode in the first direction.

12. The semiconductor device of claim 1, wherein the first layer, the second layer and the third layer comprise a same metal material.

13. A semiconductor device comprising:
a substrate;
an active region extending in a first direction on the substrate;
a plurality of channel layers provided on the active region and spaced apart from each other in a vertical direction that is perpendicular to an upper surface of the substrate;
a gate structure extending in a second direction on the substrate, crossing the active region and the plurality of channel layers, and surrounding each of the plurality of channel layers, the gate structure comprising a gate electrode;
a source/drain region provided on the active region on at least one side of the gate structure;
a first contact structure connected to the source/drain region on at least one side of the gate structure; and
a gate contact structure provided on and connected to the gate electrode,
wherein the gate contact structure comprises:
a first layer formed of a conductive material;
a second layer provided on the first layer and comprising first impurities; and
a third layer provided on the second layer and comprising second impurities, different from the first impurities,
wherein the first layer has a first thickness in the vertical direction below the second layer,
the first layer has a second thickness in a horizontal direction on a side surface of the second layer, and
the first thickness is greater than the second thickness.

14. The semiconductor device of claim 13, wherein the second thickness decreases toward a lower portion of a side surface of the first layer.

15. The semiconductor device of claim 13, wherein the first contact structure comprises a first metal material, and the gate contact structure comprises a second metal material that is different from the first metal material.

16. The semiconductor device of claim 13, wherein the first contact structure comprises:
a metal-semiconductor compound layer disposed in a recess region of the source/drain region; and
a first plug conductive layer on the metal-semiconductor compound layer, and a first barrier layer covering lower and side surfaces of the first plug conductive layer, and
wherein the metal-semiconductor compound layer comprise a first material, and the first layer comprises a second material that is different from the first material.

17. The semiconductor device of claim 15, further comprising a second contact structure provided on and connected to the first contact structure.

18. The semiconductor device of claim 17, wherein a lowermost surface of the gate contact structure is located on a lower level than a lowermost surface of the second contact structure.

19. A semiconductor device comprising:
a substrate;
an active region extending in a first direction on the substrate;
a plurality of channel layers provided on the active region and spaced apart from each other in a vertical direction that is perpendicular to an upper surface of the substrate;
a gate structure extending in a second direction on the substrate, crossing the active region and the plurality of channel layers, and surrounding each of the plurality of channel layers, the gate structure comprising a gate electrode;
a source/drain region provided on the active region on at least one side of the gate structure; and
a gate contact structure provided on and connected to the gate electrode,
wherein the gate contact structure comprises:
a first layer comprising a conductive material;
a second layer provided on the first layer and comprising at least one of boron (B) or silicon (Si); and
a third layer provided on the second layer and comprising fluorine (F).

20. The semiconductor device of claim 19, wherein the second layer has a thickness of about 1 nm to about 3 nm along an inner side surface of the first layer.

* * * * *